United States Patent [19]

Sugimura et al.

[11] Patent Number: 6,002,301
[45] Date of Patent: Dec. 14, 1999

[54] TRANSISTOR AND POWER AMPLIFIER

[75] Inventors: Akihisa Sugimura, Settsu; Kunihiko Kanazawa, Mukoh, both of Japan

[73] Assignee: Matsushita Electronics Corporation, Japan

[21] Appl. No.: 08/970,645

[22] Filed: Nov. 14, 1997

[30] Foreign Application Priority Data

Nov. 18, 1996 [JP] Japan ................................. 8-306100

[51] Int. Cl.⁶ ....................................................... H03F 3/16
[52] U.S. Cl. ........................... 330/277; 330/307; 257/287
[58] Field of Search ................................ 330/277, 307; 257/287, 365, 366, 401, 579, 560, 563

[56] References Cited

U.S. PATENT DOCUMENTS

| 3,489,963 | 1/1970 | Gillet .................................. 330/307 X |
| 4,080,577 | 3/1978 | Asada et al. ............................ 330/307 |
| 4,084,173 | 4/1978 | Fantechi .................................. 357/42 |
| 4,219,838 | 8/1980 | Lardy et al. . | |
| 4,313,126 | 1/1982 | Krumm et al. ...................... 257/287 X |
| 4,631,492 | 12/1986 | Magarshack et al. .................. 330/277 |
| 5,006,816 | 4/1991 | Koide .................................. 330/307 X |
| 5,016,079 | 5/1991 | Plagens . | |
| 5,331,192 | 7/1994 | Kudoh . | |

FOREIGN PATENT DOCUMENTS

| 54-87076 | 7/1979 | Japan . |
| 56-110257 | 9/1981 | Japan . |
| 57-109361 | 7/1982 | Japan . |
| 63-4705 | 1/1988 | Japan . |
| 3-145213 | 6/1991 | Japan . |
| 3-270166 | 12/1991 | Japan . |

Primary Examiner—Robert Pascal
Assistant Examiner—Henry Choe
Attorney, Agent, or Firm—Snell & Wilmer L.L.P.

[57] ABSTRACT

A transistor includes: a source region; at least two drain regions; channels respectively disposed between the source region and each of the at least two drain regions; and a gate electrode provided on each of the channels. The at least two drain regions are electrically isolated from one another; and a drain electrode is provided on each of the drain regions.

8 Claims, 12 Drawing Sheets

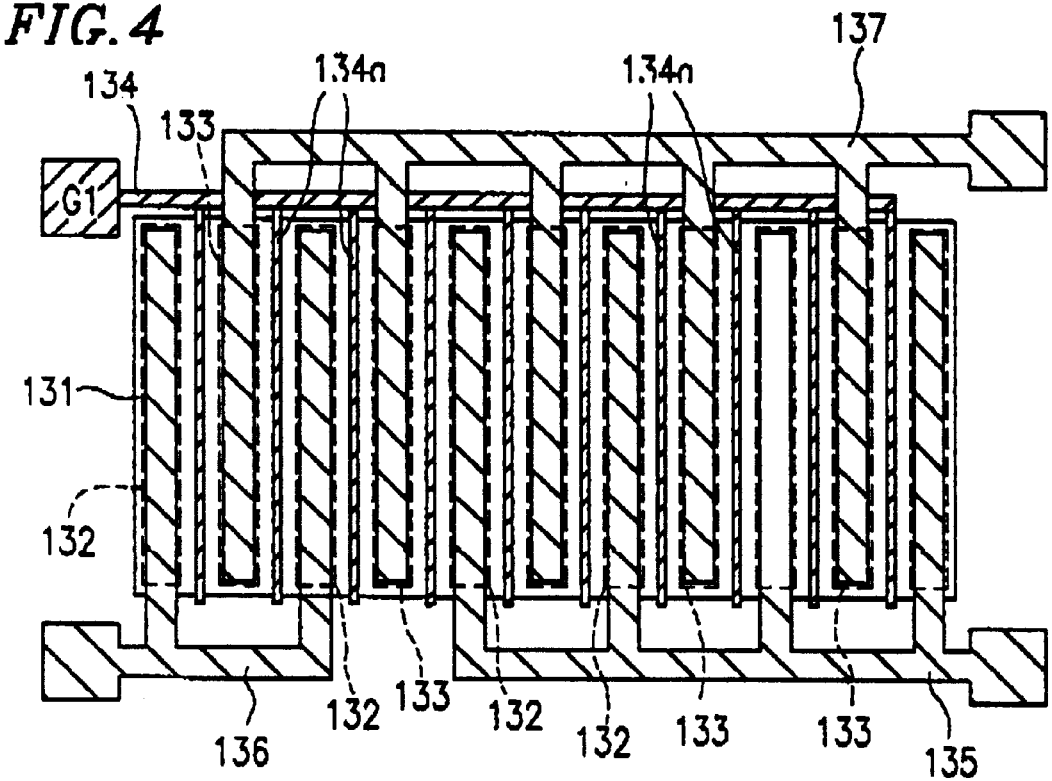

400

400

500

500

TRANSISTOR AND POWER AMPLIFIER

BACKGROUND OF THE INVENTION

1. Field of the Invention

The present invention relates to a transistor such as a field effect transistor (hereinafter, referred to as a "FET") and a bipolar transistor, and a power amplifier.

2. Description of the Related Art

One conventionally well-known power amplifier, especially a power amplifier for amplifying high-frequency signals, is the one which employs a dual-gate FET as an active element in order to reduce current consumption at the time of low-output operation.

FIG. 15 shows the structure of a conventional high frequency power amplifier. In FIG. 15, the reference numerals 1 and 2 denote an AC power input terminal and an AC power output terminal, respectively. The reference numerals 3 and 4 represent an input impedance-matching circuit and an output impedance-matching circuit, respectively. The reference numerals 5, 6 and 7 denote a first gate voltage supply circuit, a second gate voltage supply circuit, and a drain voltage supply circuit, respectively. The reference numeral 8 represents a dual-gate FET. The reference numerals 9 and 10 represent variable negative power supplies. The reference numeral 11 denotes a positive power supply. The variable negative power supply 9 supplies a bias voltage to a first gate of the dual-gate FET 8 via the first gate voltage supply circuit 5. The positive power supply 11 supplies a power supply voltage for output to a drain of the dual-gate FET 8 via the drain voltage supply circuit 7.

An input signal is input from the AC power input terminal 1 and supplied to the first gate of the dual-gate FET 8 via the input impedance-matching circuit 3 so as to be amplified by the FET 8. The amplified signal is output from the AC power output terminal 2 via the output impedance-matching circuit 4.

Currant consumption at the time of low-output operation of the high frequency power amplifier can be reduced by regulating an output voltage of the variable negative power supply 10 and controlling a voltage supplied to a second gate of the dual-gate FET 8 from the variable negative power supply 10 via the second gate voltage supply circuit 6.

In the above-described conventional high frequency power amplifier, however, although the current consumption at the time of low-output operation can be reduced by controlling the voltage of the second gate of the dual-gate FET 8, since input/output impedance of the dual-gate FET 8 significantly varies along with changes in the voltage of the second gate, electrical mismatch occurs between the input impedance-matching circuit 3 and the output impedance-matching circuit 4.

SUMMARY OF THE INVENTION

According to one aspect of the invention, a transistor includes: a source region; at least two drain regions; channels respectively disposed between the source region and each of the at least two drain regions; and a gate electrode provided on each of the channels. The at least two drain regions are electrically isolated from one another; and a drain electrode is provided on each of the drain regions.

In one embodiment of the present invention, a dual-gate electrode is provided on at least one of the channels formed between the source region and each of the drain regions.

In another embodiment of the present invention, a boundary between an insulation region and an active region coincides with an edge of the gate electrode when the insulation region is a region electrically isolating the drain regions from one another and the active region is a region under the gate electrode, forming the channels at portions interposed between the source region and each of the drain regions.

According to another aspect of the invention, a transistor includes a plurality of source regions and a plurality of drain regions disposed in an alternate manner. Each of the source regions is commonly connected to a source electrode and the drain regions are divided into two groups so that each of the drain regions in one group is commonly connected to a first drain electrode and each of the drain regions in the other group is commonly connected to a second drain electrode. A comb-shaped gate electrode is provided on channels each disposed between each of the source regions and each of the drain regions.

According to still another aspect of the invention, a transistor includes a plurality of source regions and a plurality of drain regions disposed in an alternate manner. Each of the source regions is commonly connected to a source electrode and the drain regions are divided into two groups so that each of the drain regions in one group is commonly connected to a first drain electrode and each of the drain regions in the other group is commonly connected to a second drain electrode. A comb-shaped first gate electrode is provided on channels each disposed between each of the source regions and each of the drain regions and a comb-shaped second gate electrode is provided on at least one channel adjacent to the first drain electrode, among the channels, so that a dual-gate electrode formed of the first gate electrode and the second gate electrode is provided on the at least one channel adjacent to the first drain electrode.

According to still yet another aspect of the invention, a transistor includes: an emitter; at least two collectors; and a base disposed between the emitter and the collectors. The collectors are electrically isolated from one another; and a collector electrode is provided on each of the collectors.

In one embodiment of the present invention, an insulator is disposed between the collectors.

According to still yet another aspect of the invention, a power amplifier includes: a transistor including a source region, first and second drain regions, channels respectively disposed between the source region and each of the first and the second drain regions, and a gate electrode formed on each of the channels, wherein the first and the second drain regions are electrically isolated from each other, and first and second drain electrodes are provided on the first and the second drain regions, respectively. Also included are: a first impedance-matching circuit inserted between an input terminal for inputting an input signal and the gate electrode of the transistor; a second impedance matching circuit inserted between the first and the second drain electrodes of the transistor and an output terminal for outputting an output signal; a gate DC voltage source circuit which is connected to the gate electrode of the transistor; a first drain DC voltage source circuit which is connected to the first drain electrode of the transistor; a second drain DC voltage source circuit which is connected to the second drain electrode of the transistor; and a controlling circuit for performing an ON/OFF operation of the first drain DC voltage source circuit.

According to still yet another aspect of the invention, a power amplifier includes: a transistor including an emitter, first and second collectors, and a base disposed between the emitter and the first and the second collectors, wherein the first and the second collectors are electrically isolated from each other, and first and second collector electrodes are provided in the first and the second collectors, respectively. Also included are: a first impedance-matching circuit inserted between an input terminal for inputting an input signal and the base of the transistor; a second impedance-matching circuit inserted between the first and the second collector electrodes of the transistor and an output terminal for outputting an output signal; a base DC voltage source circuit connected to the base of the transistor; a first collector DC voltage source circuit connected to the first collector electrode of the transistor; a second collector DC voltage source circuit connected to the second collector electrode of the transistor; and a controlling circuit for performing an ON/OFF operation of the first collector DC voltage source circuit.

According to still yet another aspect of the invention, a power amplifier includes: a transistor including a source region, first and second drain regions, channels respectively disposed between the source region and each of the first and the second drain regions, a first gate electrode formed on the channels, and a second gate electrode formed on the channel disposed between the source region and the first drain region, wherein the first and the second drain regions are electrically isolated from each other, and first and second drain electrodes are provided in the first and the second drain regions, respectively. Also included are: a first impedance-matching circuit inserted between an input terminal for inputting an input signal and the first gate electrode of the transistor; a second impedance-matching circuit inserted between the first and the second drain electrodes of the transistor and an output terminal for outputting an output signal; a first gate DC voltage source circuit connected to the first gate electrode of the transistor; a second gate DC voltage source circuit connected to the second gate electrode of the transistor; a first drain DC voltage source circuit connected to the first drain electrode of the transistor; a second drain DC voltage source circuit connected to the second drain electrode of the transistor; and a controlling circuit for performing an ON/OFF operation of the first drain DC voltage source circuit and for controlling an output voltage of the first and the second gate DC voltage source circuits.

According to the present invention described above, outputs from a plurality of drains are used at the time of high output power operation of the power amplifier. On the other hand, at low output power operation of the power amplifier, an output only from one drain is used and the other drain is used as a negative feedback circuit. As a result, the match between the input and the output can be retained both at the time of high output power operation and at the time of low output power operation.

Thus, the invention described herein makes possible the advantages of (1) providing a transistor which is preferable for a power amplifier capable of reducing current consumption at the time of low output operation while maintaining a match between the input and the output; and (2) providing a power amplifier structured using the transistor.

These and other advantages of the present invention will become apparent to those skilled in the art upon reading and understanding the following detailed description with reference to the accompanying figures.

BRIEF DESCRIPTION OF THE DRAWINGS

FIG. 4 is a plan view illustrating a FET according to Example 2 of the present invention.

DESCRIPTION OF THE PREFERRED EMBODIMENTS

Hereinafter, the present invention will be described by way of illustration, but non-limiting examples with reference to the accompanying drainages.

EXAMPLE 1

Figure 1:
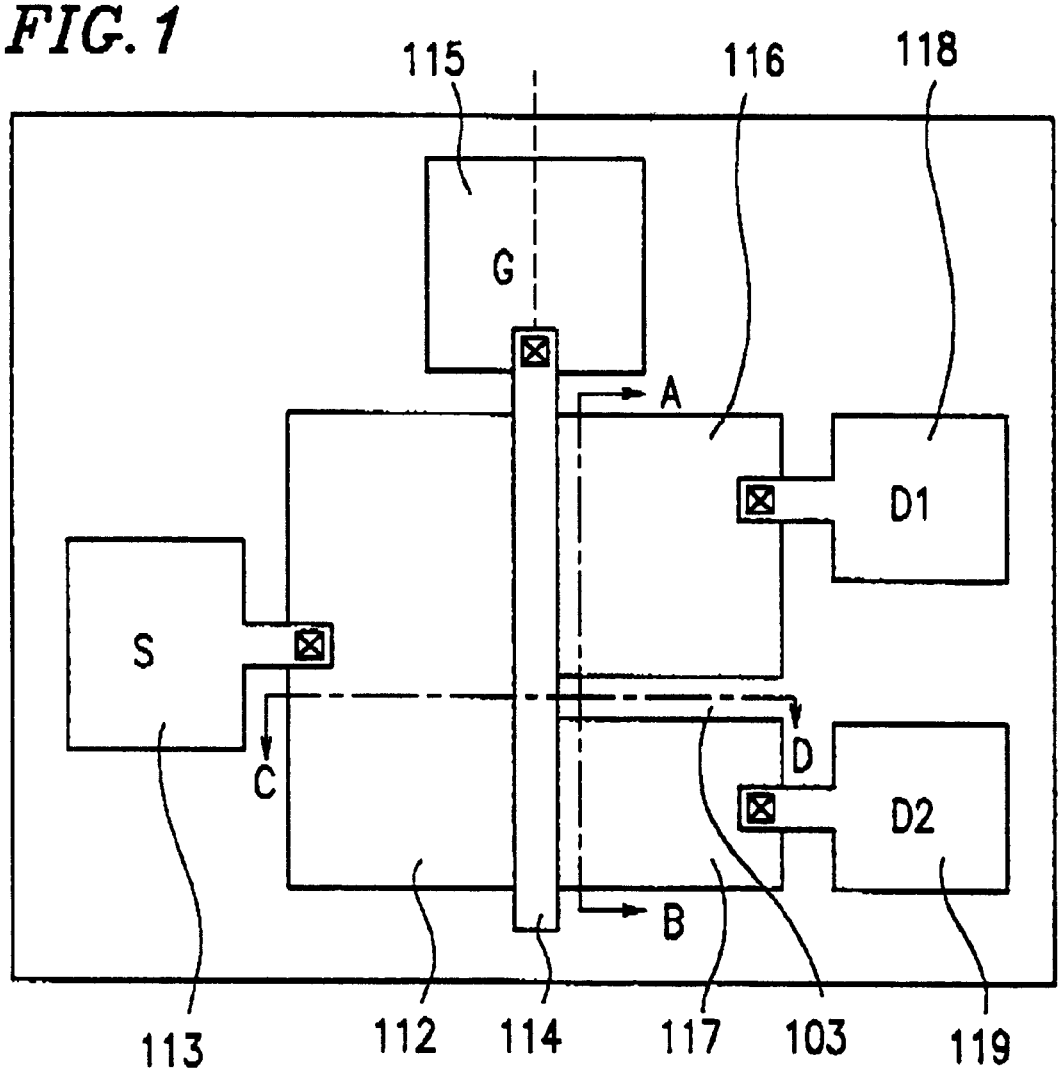
FIG. 1 is a plan view illustrating a FET according to Example 1 of the present invention.
Figure 2:
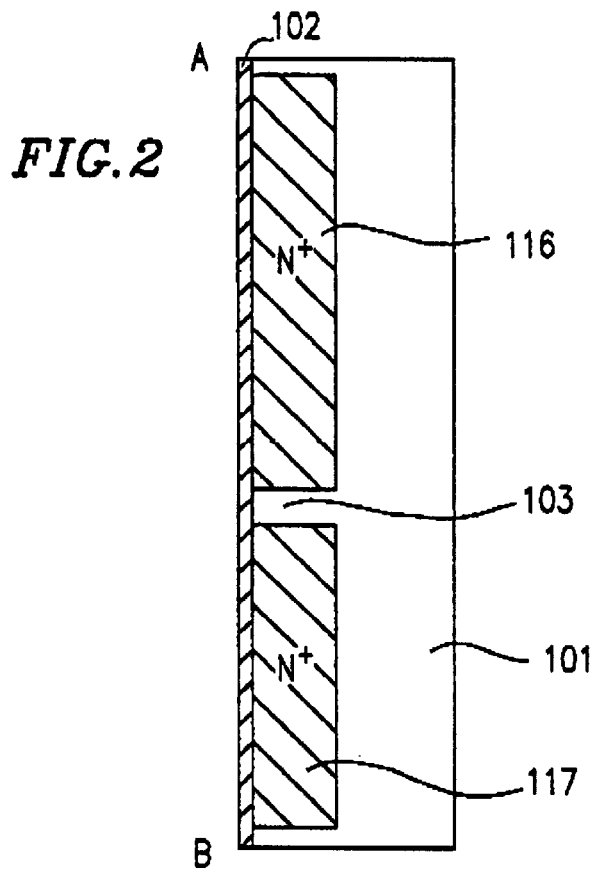
FIG. 2 is a cross-sectional view illustrating the FET of Example 1 shown in FIG. 1 taken along a line A-B.
Figure 3A:
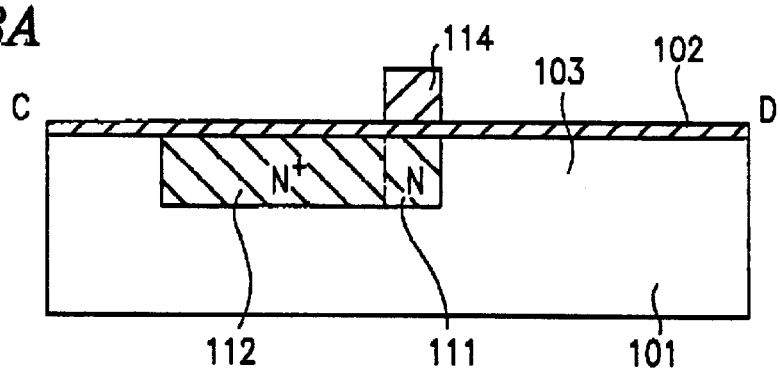
FIG. 3A is a cross-sectional view illustrating the FET of Example 1 shown in FIG. 1 taken along a line C-D.

FIG. 1 is a plan view showing a FET according to Example 1 of the present invention. FIG. 2 is a cross-sectional view of the FET shown in FIG. 1 taken along a line A-B. FIG. 3A is a cross-sectional view of the FET shown in FIG. 1 taken along a line C-D.

In this FET, a source region 112, an active layer region 111, a first drain region 116, and a second drain region 117 are formed on a surface layer of an insulating semiconductor substrate 101. The source region 112 is disposed so as to be adjacent to one side of the active layer region 111 and the first and the second drain regions 116 and 117 are disposed so as to be adjacent to the other side of the active layer region 111.

An insulation film 102 is provided on the insulating semiconductor substrate 101. A first gate electrode 114 is formed on the insulation film 102 so as to overlap the active layer region 111. Also provided on the insulation film 102 are a source electrode 113, a gate line 115 as a bonding pad, a first drain electrode 118, and a second drain electrode 119. The source region 112 is connected to the source electrode 113 via a hole of the insulation film 102. The first drain region 116 and the second drain region 117 are connected to the first drain electrode 118 and the second drain electrode 119, respectively, via the respective holes of the insulation film 102. The first gate electrode 114 is connected to the gate line 115 as a bonding pad.

An insulation region 103 is provided between the first drain region 116 and the second drain region 117. The first drain region 116 and the second drain region 117 are insulated from each other with the insulation region 103 interposed therebetween.

An edge of the first gate electrode 114 adjacent to the first and the second drain regions 116 and 117 coincides with an edge of the active layer region 111. As can be seen from FIG. 3A, the edge of the first gate electrode 114 also aligned with the edge of the active layer region 111 at a boundary site between the active layer region 111 and the insulation region 103.

Figure 3B:
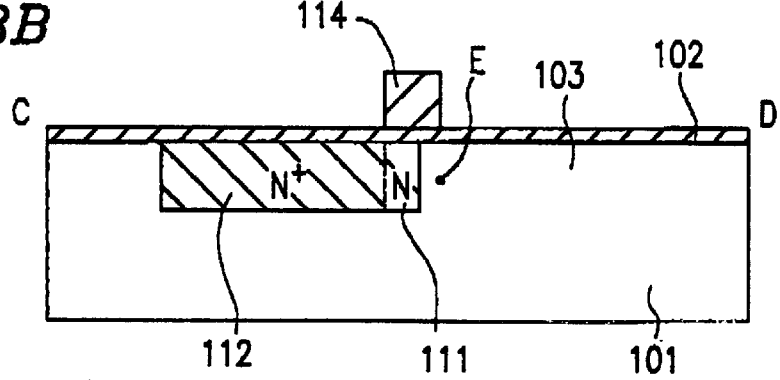
FIG. 3B is a cross-sectional view illustrating a comparative example for the FET of Example 1.

Normal operation of the FET is maintained by aligning the edge of the first gate electrode 114 with the edge of the insulation region 103 at the boundary site between the active layer region 111 and the insulation region 103. As shown in FIG. 3B, if the edge of insulation region 103 at the boundary site between the active layer region 111 and the insulation region 103 extends to a position corresponding to the vicinity of the center of the bottom surface of the first gate electrode 114, an electric field concentration occurs at a site E under the first gate electrode 114, where the insulation region 103 is extended. As a result, normal operation of the FET can no longer be maintained.

With such a structure, two drain regions which are electrically isolated from each other can be formed for the FET including one source region and one gate region. Accordingly, two driving units, i.e., two drains can be provided in one transistor.

Although two drain regions are formed in Example 1 of the present invention, three or more drain regions may be provided so as to be isolated from one another on one side of the active layer region.

EXAMPLE 2

FIG. 4 is a plan view showing a FET according to Example 2 of the present invention. The FET includes comb-shaped electrodes. An active layer region 131 is formed on a surface layer of an insulating semiconductor substrate (not shown). Within the active layer region 131, a plurality of drain regions 132 and a plurality of source regions 133 are formed in an alternate manner. After a first insulation film is provided on the insulating semiconductor substrate, a comb-shaped gate electrode 134 is formed. Provided on the gate electrode 134 is a second insulation film. Comb-shaped first and second drain electrodes 135 and 136 and a source electrode 137 are provided on the second insulation film.

The plurality of drain regions 132 are divided into two sets of drain region groups. Each drain region 132 in one set is commonly connected to the first drain electrode 135 via the respective holes of the first and the second insulation films, whereas each drain region 132 in the other set is commonly connected to the second drain electrode 136 via the respective holes of the first and the second insulation films. The source regions 133 are commonly connected to the source electrode 137 via the respective boles of the first and the second insulation films.

Each branch potion 134a of the gate electrode 134 is positioned between each of the drain regions 132 and each of the source regions 133.

In the case of the FET having such comb-shaped electrodes, the drain regions 132 interpose the respective source region 133 therebetween, so that the drain regions 132 are isolated from one another by the existence of the respective source regions 133. Thus, there is no special need for providing an insulation region for electrically isolating the drain regions 132 from one another.

EXAMPLE 3

Figure 5:
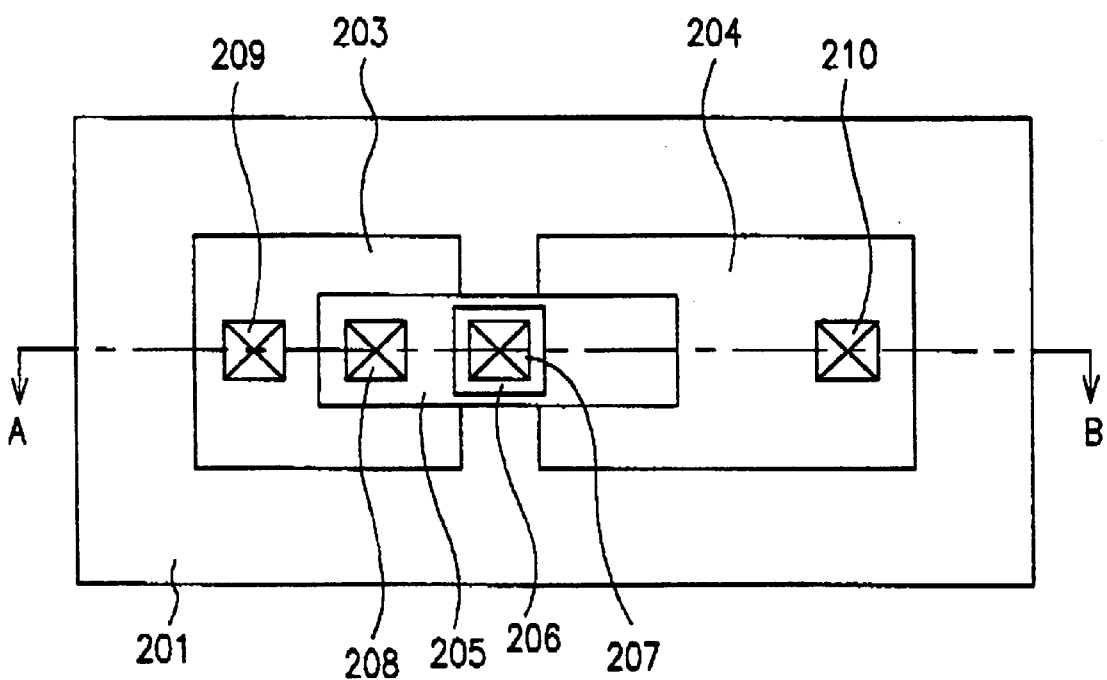
FIG. 5 is a plan view illustrating a bipolar transistor according to Example 3 of the present invention.
Figure 6:
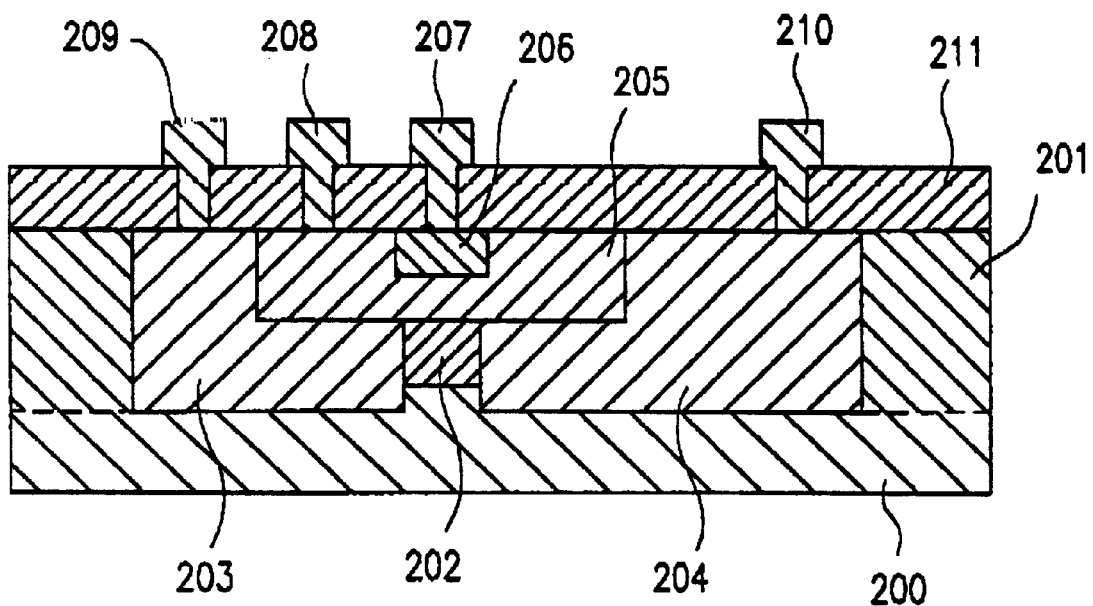
FIG. 6 is a cross-sectional view illustrating the bipolar transistor of Example 3 shown in FIG. 5 taken along a line A-B.

FIG. 5 is a plan view showing a bipolar transistor according to Example 3 of the present invention. FIG. 6 is a cross-sectional view of the bipolar transistor shown in FIG. 5 taken along a line A-B.

In the bipolar transistor, an island portion which is isolated from its peripheral region by a $P^+$-type separation region 201 is formed on a surface layer of a P-type semiconductor substrate 200. Within the island portion, a separating insulation film 202 is formed by selective oxidization by ion implantation or the like. A first collector region 203 and a second collector region 204 are formed at both sides of the separating insulation film 202. A base region 205 stretching over the first collector region 203 and the second collector region 204 is formed. A emitter region 206 is formed within the base region 205, and an insulation film 211 is formed thereon. After holes are formed in the insulation film 211, an emitter electrode 207, a base electrode 208, a first collector electrode 209, and a second collector electrode 210 are formed on the insulation film 211. The emitter electrode 207 is connected to the emitter region 206, and the base electrode 208 is connected to the base region 205. The first collector electrode 209 is connected to the first collector region 203, and the second collector electrode 210 is connected to the second collector region 204.

The separating insulation film 202 serves to isolate the first and the second collector electrodes 209 and 210 from each other and also serves to isolate the base region 205 and a P-type substrate 200 from each other.

With such a structure, two collector regions which are electrically isolated from each other can be formed for the transistor including one emitter region and one base region. Accordingly, two driving units, i.e., two collectors, can be provided in one transistor.

Although two collector regions are formed in Example 3 of the present invention, three or more collector regions may be formed. In such a case, the collector regions are separated by the respective separating insulating films, and a base region stretching over these collector regions is formed. Then, an emitter region is formed within the base region.

EXAMPLE 4

Figure 7:
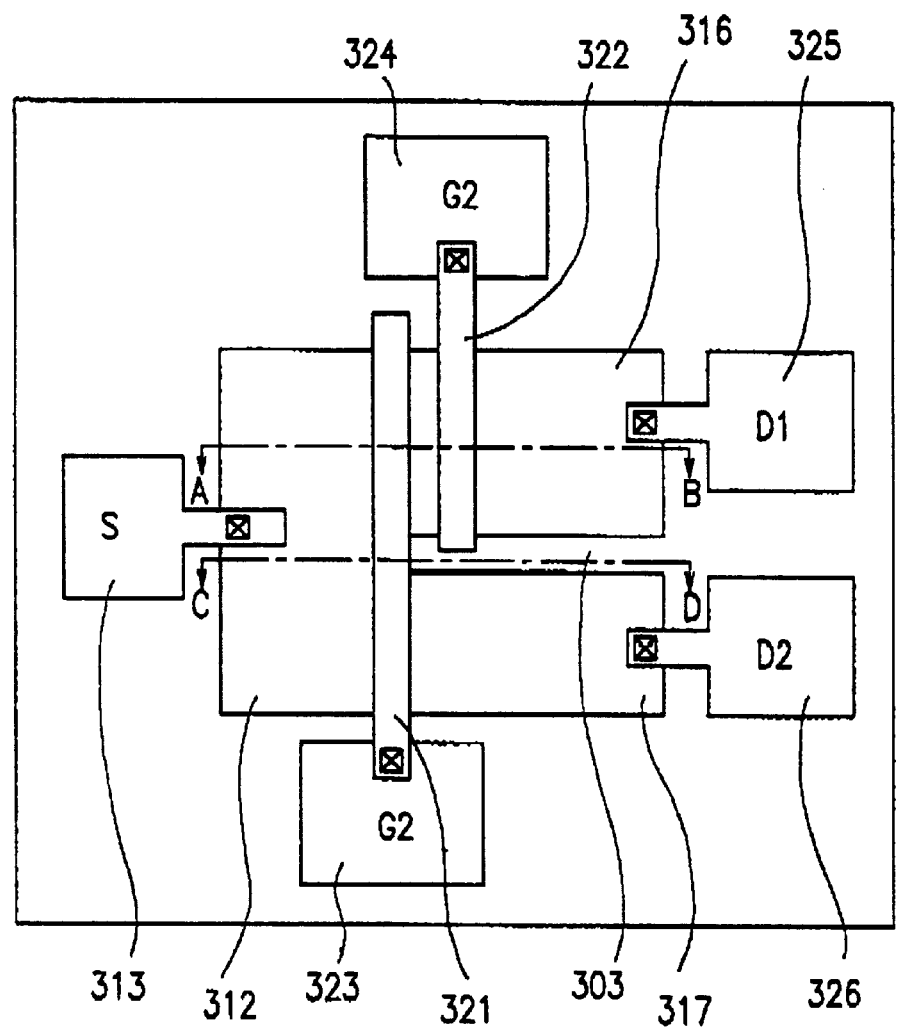
FIG. 7 is a plan view illustrating a FET according to Example 4 of the present invention.
Figure 8:
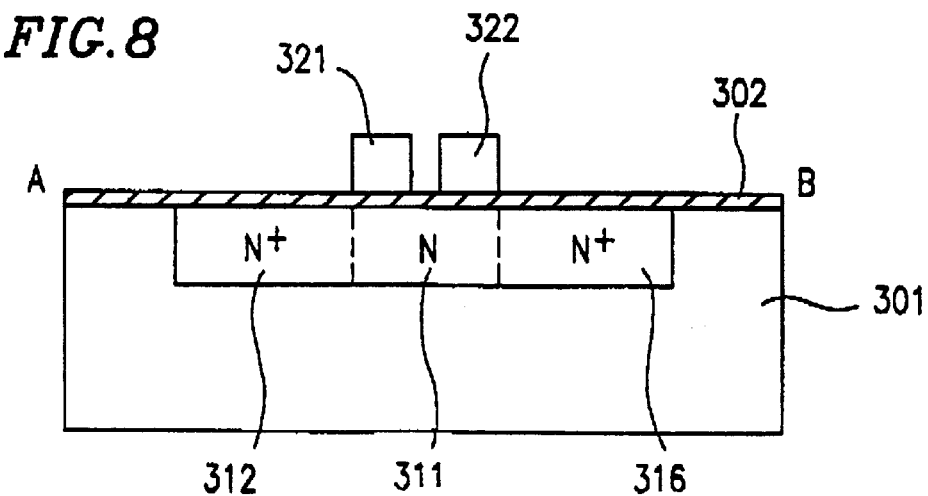
FIG. 8 is a cross-sectional view illustrating the FET of Example 4 shown in FIG. 7 taken along a line A-B.
Figure 9:
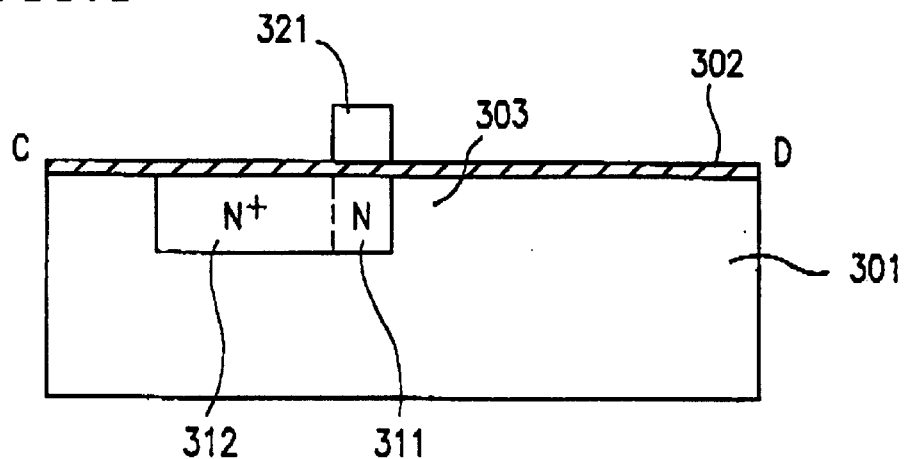
FIG. 9 is a cross-sectional view illustrating the FET of Example 4 shown in FIG. 7 taken along a line C-D.

FIG. 7 is a plan view of a FET according to Example 4 of the present invention. FIG. 8 is a cross-sectional view of the FET shown in FIG. 7 taken along a line A-B. FIG. 9 is a cross-sectional view of the FET shown in FIG. 7 taken along a line C-D.

In the FET, a source region 312, an active layer region 311, a first drain region 316 and a second drain region 317 are formed on a surface layer of an insulating semiconductor substrate 301. The source region 312 is disposed so as to be adjacent to one side of the active layer region 311, and the first and the second drain regions 316 and 317 are disposed so as to be adjacent to the other side of the active layer region 311.

An insulation film 302 is provided on the insulating semiconductor substrate 301. A first gate electrode 321 and a second gate electrode 322 are formed on the insulation film 302 so as to overlap the active layer region 311. A source electrode 313, a gate line 323 as a bonding pad, a gate line 324 as a bonding pad, a first drain electrode 325, and a second drain electrode 326 are formed on the insulation film 302. The source region 312 is connected to the source electrode 313 via a hole of the insulation film 302. The first and the second drain regions 316 and 317 are connected to the first and the second drain electrodes 325 and 326, respectively, via the respective holes of the insulation film 302. The first gate electrode 321 and the second gate electrode 322 are connected to the gate lines 323 and 324 as bonding pads, respectively.

An insulation region 303 is provided between the first drain region 316 and the second drain region 317.

An edge of the first gate electrode 321 coincides with an edge of the insulation region 303 at a boundary site between the active layer region 311 and the insulation region 303.

With such a structure, two drain regions which are electrically isolated from each other can be formed for the FET including one source region and one gate region. Accordingly, two driving units can be provided in one transistor. Also, a dual gate corresponding to the first drain region 316, which is formed of the first gage electrode 321 and the second gate electrode 322, can be formed, and a single gate corresponding to the second drain region 317, which is formed of the first gate electrode 321 alone, can be formed. Thus, the FET has both of the structure including a single gate and two driving units and the structure including a dual gate and two driving units.

Although two drain regions are formed in Example 4 of the present invention, three or more drain regions may be formed on one side of the active layer region so as to be isolated from each other.

Figure 10:
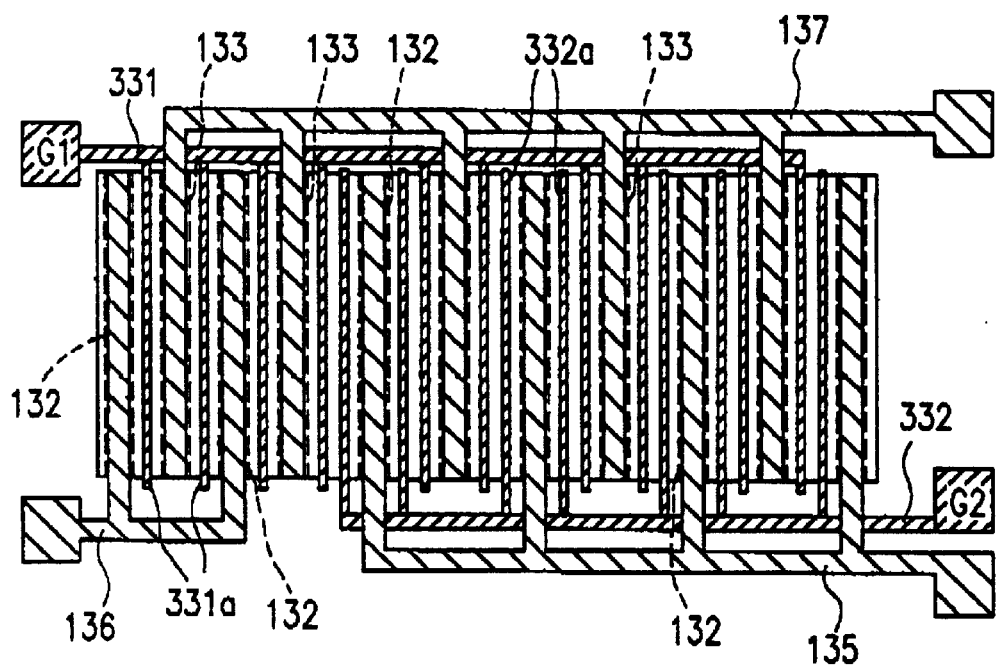
FIG. 10 is a plan view illustrating a modification of the FET according to the present invention.

Alternatively, as shown in FIG. 10, comb-shaped electrodes may be employed in the FET with a dual gate. In such a case, each branch portion 331a of the first gate electrode 331 is aligned with each of the drain regions 132, and branch portions 332a of the second gate electrode 332 are selectively aligned with some of the drain regions 132. In FIG. 10, components having the same effect as those in FIG. 4 are denoted by the same reference numerals and the description thereof is omitted.

EXAMPLE 5

Figure 11:
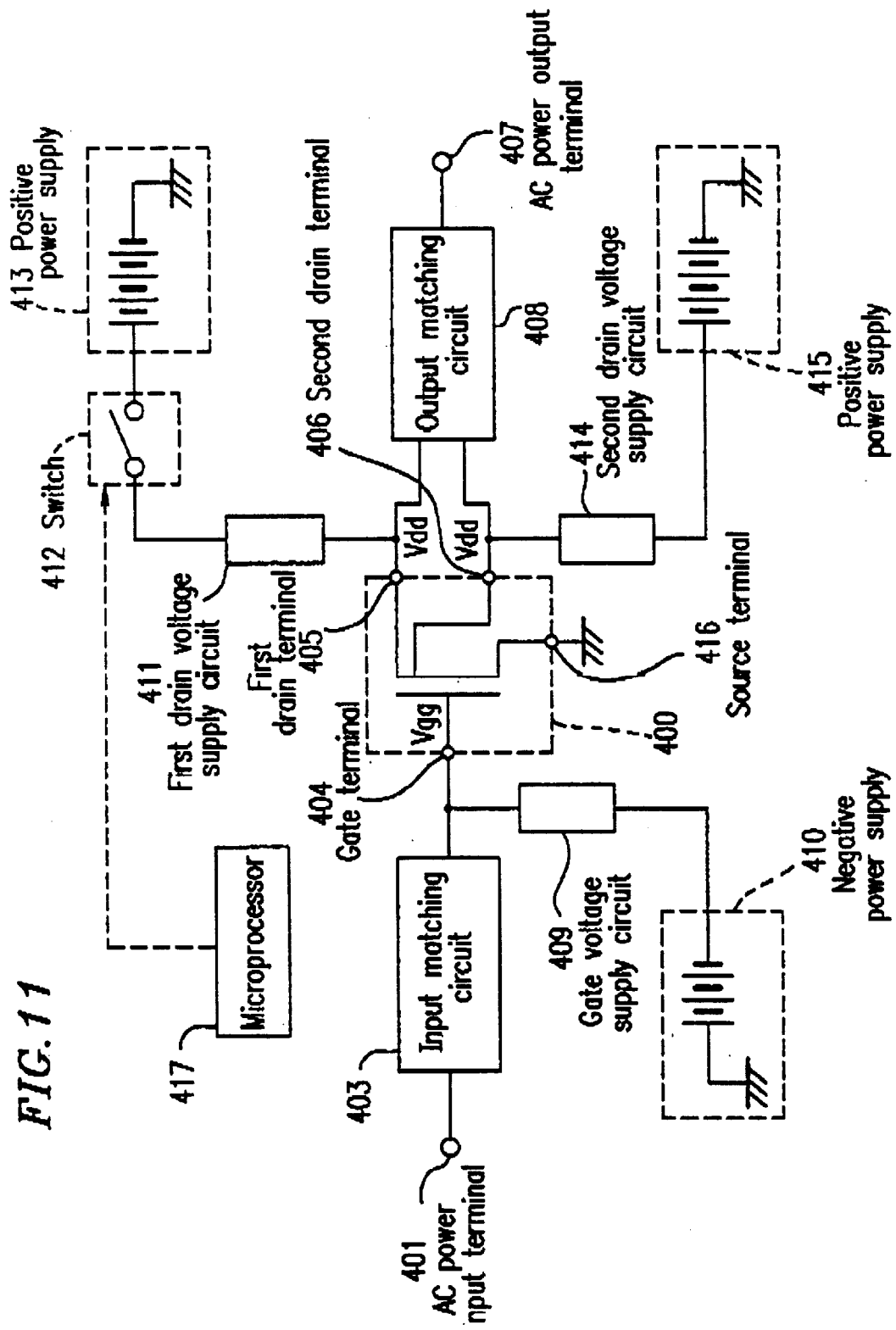
FIG. 11 is a block diagram illustrating a high frequency power amplifier according to Example 5 of the present invention.

FIG. 11 is a block diagram illustrating a high frequency power amplifier according to Example 5 of the present invention. The FET in Example 1 of the present invention is employed in the power amplifier of Example 5. In FIG. 11, the FET is denoted by the reference numeral 400.

According to this power amplifier, an input impedance-matching circuit 403 is inserted between an AC power input terminal 401 and a gate terminal 404 of the FET 400 (the gate terminal 404 is connected to the gate line 115 as a bonding pad). An output impedance-matching circuit 408 is inserted between first and second drain terminals 405 and 406 of the FET 400 and an AC power output terminal 407 (the first and the second drain terminals 405 and 406 are connected to the first and the second drain electrodes 118 and 119, respectively). A gate voltage supply circuit 409 and a negative power supply 410 are inserted between the gate terminal 404 and a ground in a serially-connected manner. A first drain voltage supply circuit 411, a switch 412, and a positive power supply 413 are inserted between the first drain terminal 405 and a ground in a serially-connected manner. A second drain voltage supply circuit 414 and a positive power supply 415 are inserted between the second drain terminal 406 and a ground in a serially-connected manner. A source terminal 416 of the FET 400 is grounded (the source terminal 416 is connected to the source electrode 113).

Switching control of the switch 412 is performed by a microprocessor 417. The microprocessor 417 controls the switch 412 in accordance with the magnitude of power to be output from the high frequency power amplifier. When a large amount of power is to be output, the switch 412 is turned ON, and when a small amount of power is to be output, the switch 412 is turned OFF.

The gate voltage supply circuit 409 and the negative power supply 410 constitute a DC voltage source circuit and supply a voltage Vgg to the gate terminal 404 of the FET 400. The first drain voltage supply circuit 411 and the positive power supply 413 constitute a DC voltage source circuit, whereas the second drain voltage supply circuit 414 and the positive power supply 415 constitute a DC voltage source circuit. These DC voltage source circuits supply the same level of voltage Vdd to the first drain terminal 405 and the second drain terminal 406 of the FET 400, respectively.

Input/output characteristics of the input impedance-matching circuit 403 and the output impedance-matching circuit 408, the voltage Vgg, and the voltage Vdd are determined by he characteristics required by the high frequency power amplifier.

When the thus structured high frequency power amplifier is operated at a high level output, the voltage Vgg is applied to the gate terminal 404. At the same time, the switch 412 is turned ON by the microprocessor 417 so as to apply the same level of voltage Vdd to each of the first and the second drain terminals 405 and 406.

Figure 12A:
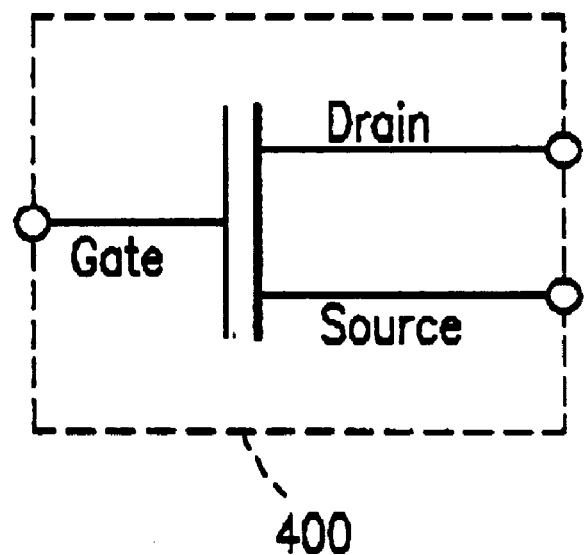
FIG. 12A is a view illustrating an equivalent circuit of a FET in the high frequency power amplifier of Example 5.

At this time, the FET 400 is represented by an equivalent circuit as shown in FIG. 12A. More specifically, the high frequency power amplifier at the time of high output operation is equivalent to that employing a FET having a typical structure as an active element.

When the high frequency power amplifier according to Example 5 of the present invention is operated at a low level output, the voltage Vgg is applied to the gate terminal 404. At the same time, the switch 412 is turned OFF by the microprocessor 417 so that voltage application to the first drain terminal 405 is stopped, thereby applying the voltage Vdd only to the second drain terminal 406.

Figure 12B:
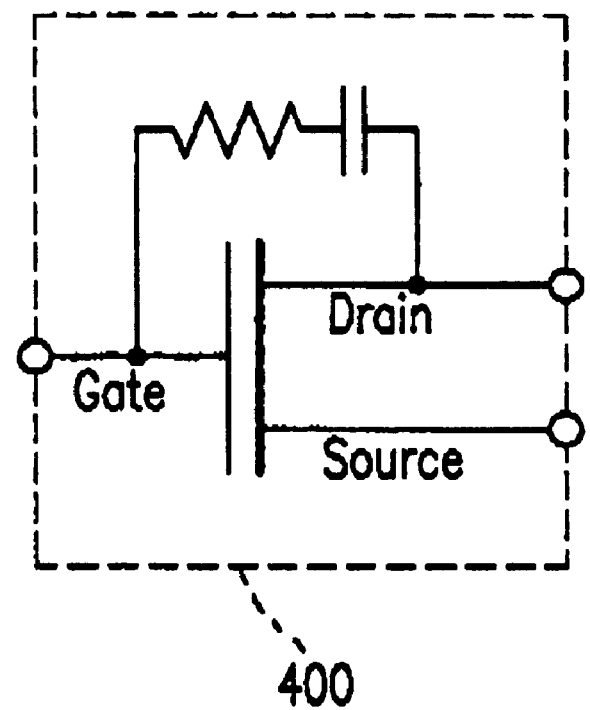
FIG. 12B is a view illustrating another equivalent circuit of the FET in the high frequency power amplifier of Example 5.

At this time (low power output), the FET 400 is represented by an equivalent circuit as shown in FIG. 12B.

In the FET 400, two channels electrically isolated from each other are formed in associated with the formation of two drain regions. The voltage Vdd is applied only to the second drain terminal 406, whereas no voltage Vdd is applied to the first drain terminal 405. Then, only the channel corresponding to the second drain region 117 is operated while the other channel corresponding to the first drain region 116 is not operated. As a result, an amount of operating current significantly falls.

For example, when a ratio of a gate width corresponding to the first and the second drain regions 116 and 117 and a gate width corresponding only to the second drain region 117 are made to be 9:1, current consumption at the time of low output operation becomes $1/10$ of the maximum output power when all of the channels are operated.

The channel in an non-operation state serves as a negative feedback circuit for the channel in an operation state. Accordingly, the high frequency power amplifier at the time of low output operation is equivalent to the power amplifier which employs a typical FET as an active element and includes a typical negative feedback circuit.

In general, smaller gate width of the channel in an operation state results in larger input/output impedance. On the other hand, input/output impedance can be reduced by applying a negative feedback to the FET.

According to the high frequency power amplifier in Example 5 of the present invention, since only one of the channels of the FET 400 is operated at the time of low output operation, the gate width becomes small, resulting in an increase in the input/output impedance. However, since a negative feedback is applied, the input/output impedance of the FET 400 can be maintained substantially the same as that at the time of a high output operation.

As described above, the high frequency power amplifier according to Example 5 of the present invention has a significant advantage that since a negative feedback is applied at the time of a low output operation, current consumption can be significantly reduced at the time of the low output operation while maintaining substantially the same input/output impedance-matching condition between the time of low output operation and the time of high output operation.

A high frequency power amplifier can be structured in the same manner as described in this example by employing the bipolar transistor of Example 3 in lieu of the FET of Example 1. In such a case, the gate terminal is replaced by a base terminal, and the source terminal is replaced by an emitter terminal. Also, the first drain terminal is replaced by a first collector terminal and the second drain terminal is replaced by a second collector terminal.

Moreover, although a single high frequency power amplifier is formed in Example 5, multiple high frequency power amplifiers can be structured by serially connecting two or more high frequency power amplifiers so as to obtain a high frequency power amplifier having an increased power gain.

EXAMPLE 6

Figure 13:
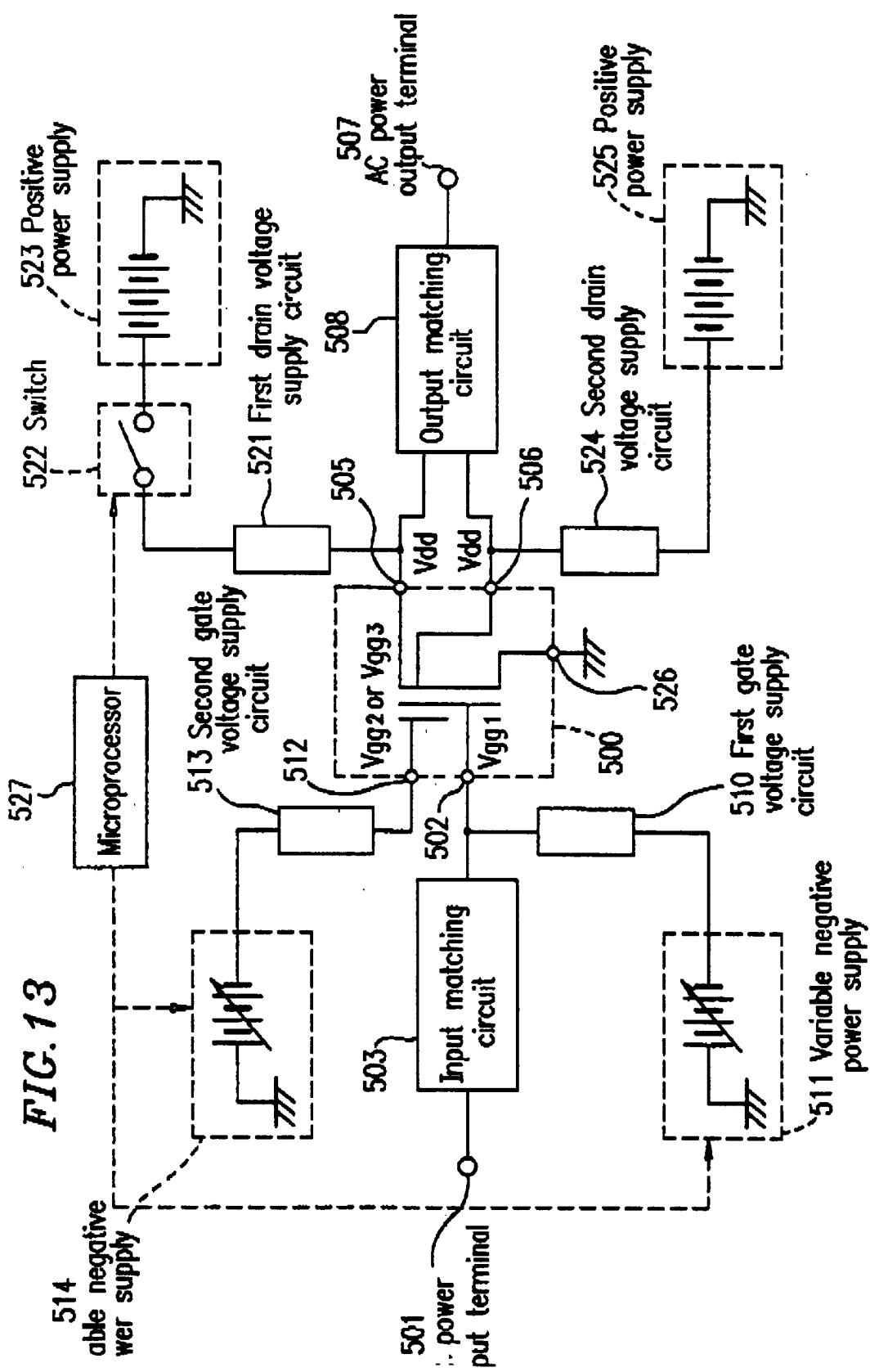
FIG. 13 is a block diagram illustrating a high frequency power amplifier according to Example 6 of the present invention.

FIG. 13 is a block diagram illustrating a high frequency power amplifier according to Example 6 of the present invention. The power amplifier of Example 6 employs the FET of Example 4. The FET is denoted by the reference numeral 500 in FIG. 13.

In this power amplifier, an input impedance-matching circuit 503 is inserted between an AC power input terminal 501 and a first gate terminal 502 of the FET 500 (the first gate terminal 502 is connected to the gate line 323 as a bonding pad). An output impedance-matching circuit 508 is inserted between first and second drain terminals 505 and 506 of the FET 500 and an AC power output terminal 507 (the first and the second drain terminals 505 and 506 are connected to the first and the second drain electrodes 325 and 326, respectively). A first gate voltage supply circuit 510 and a variable negative power supply 511 are inserted between the first gate terminal 502 and a ground in a serially-connected manner. A second gate voltage supply circuit 513 and a variable negative power supply 514 are inserted between the second gate terminal 512 and a ground in a serially-connected manner (the second gate terminal 512 is connected to the gate line 324 as a bonding pad). A first drain voltage supply circuit 521, a switch 522, and a positive power supply 523 are inserted between the first drain terminal 505 and a ground in a serially-connected manner. A second drain voltage supply circuit 524 and a positive power supply 525 are inserted between the second drain terminal 506 and a ground in a serially-connected manner. A source terminal 526 of the FET 500 is grounded (the source terminal 526 is connected to the source electrode 313).

Switching control of the switch 522 is performed by a microprocessor 527. The microprocessor 527 controls the switch 522 in accordance with the magnitude of power to be output from the high frequency power amplifier. When a large amount of power is to be output, the switch 522 is turned ON, and when a small amount of power is to be output, the switch 522 is turned OFF.

The variable negative power supply 511 is controlled by the microprocessor 527 and supplies a voltage Vgg1 to the first gate terminal 502 of the FET 500. The variable negative power supply 514 is controlled by the microprocessor 527 and supplies either a voltage Vgg2 or a voltage Vgg3 to the second gate terminal 512 of the FET 500. Each of the positive power supplies 523 and 525 supplies the same level of voltage Vdd to each of the first drain terminal 505 and the second drain terminal 506 of the FET 500.

Input/output characteristics of the input impedance-matching circuit 503 and the output impedance-matching circuit 508 and each of the voltages Vgg1, Vgg2, Vgg3, and Vdd are determined by the characteristics required by the high frequency power amplifier.

When the thus structured high frequency power amplifier is operated at a high level output, the voltage Vgg1 is applied to the first gate terminal 502, and simultaneously the voltage Vgg2 is applied to the second gate terminal 512. Also, the switch 522 is turned ON by the microprocessor 527 so as to apply the same level of voltage Vdd to each of the first and the second drain terminals 505 and 506.

Figure 14A:
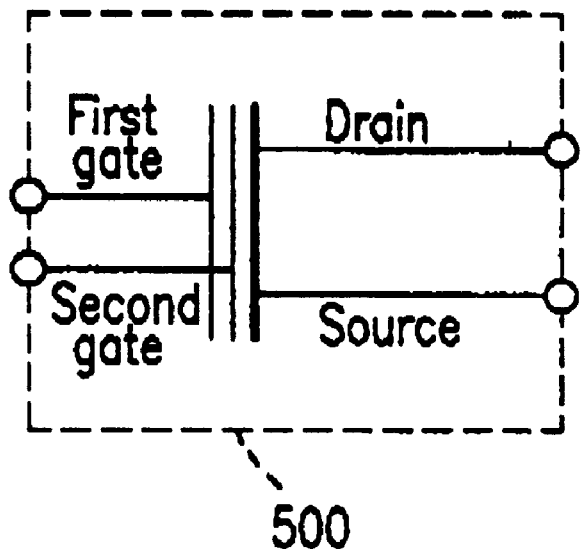
FIG. 14A is a view illustrating an equivalent circuit of a FET in the high frequency power amplifier of Example 6.

At this time, the FET 500 is represented by an equivalent circuit as shown in FIG. 14A. More specifically, the high frequency power amplifier at the time of high output operation is equivalent to that employing a FET having a typical dual-gate structure as an active element.

When the high frequency power amplifier according to Example 6 of the present invention is operated at a low level output, the voltage Vgg1 is applied to the first gate terminal 502. At the same time, the variable negative power supply 514 is controlled by the microprocessor 527 so as to apply the voltage Vgg3 which satisfies conditions described below to the second gate terminal 512. The switch 522 is turned OFF by the microprocessor 527 so that voltage application to the first drain terminal 505 is stopped, thereby applying the voltage Vdd only to the second drain terminal 506.

Figure 14B:
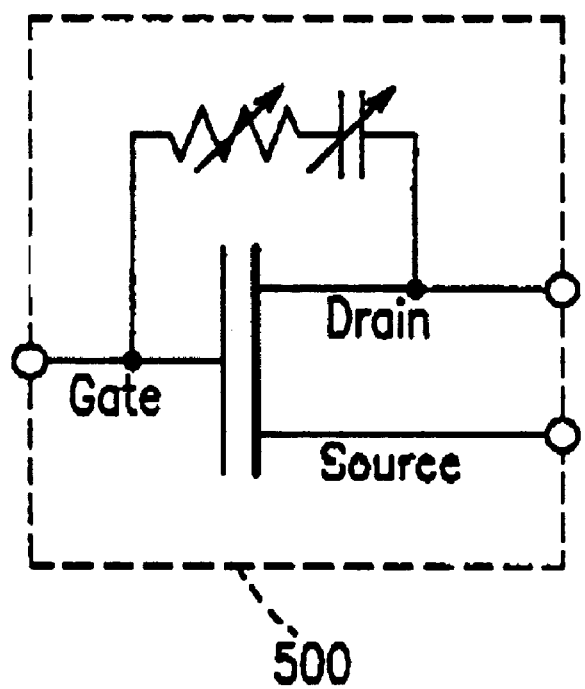
FIG. 14B is a view illustrating another equivalent circuit of the FET in the high frequency power amplifier of Example 6.
Figure 15:
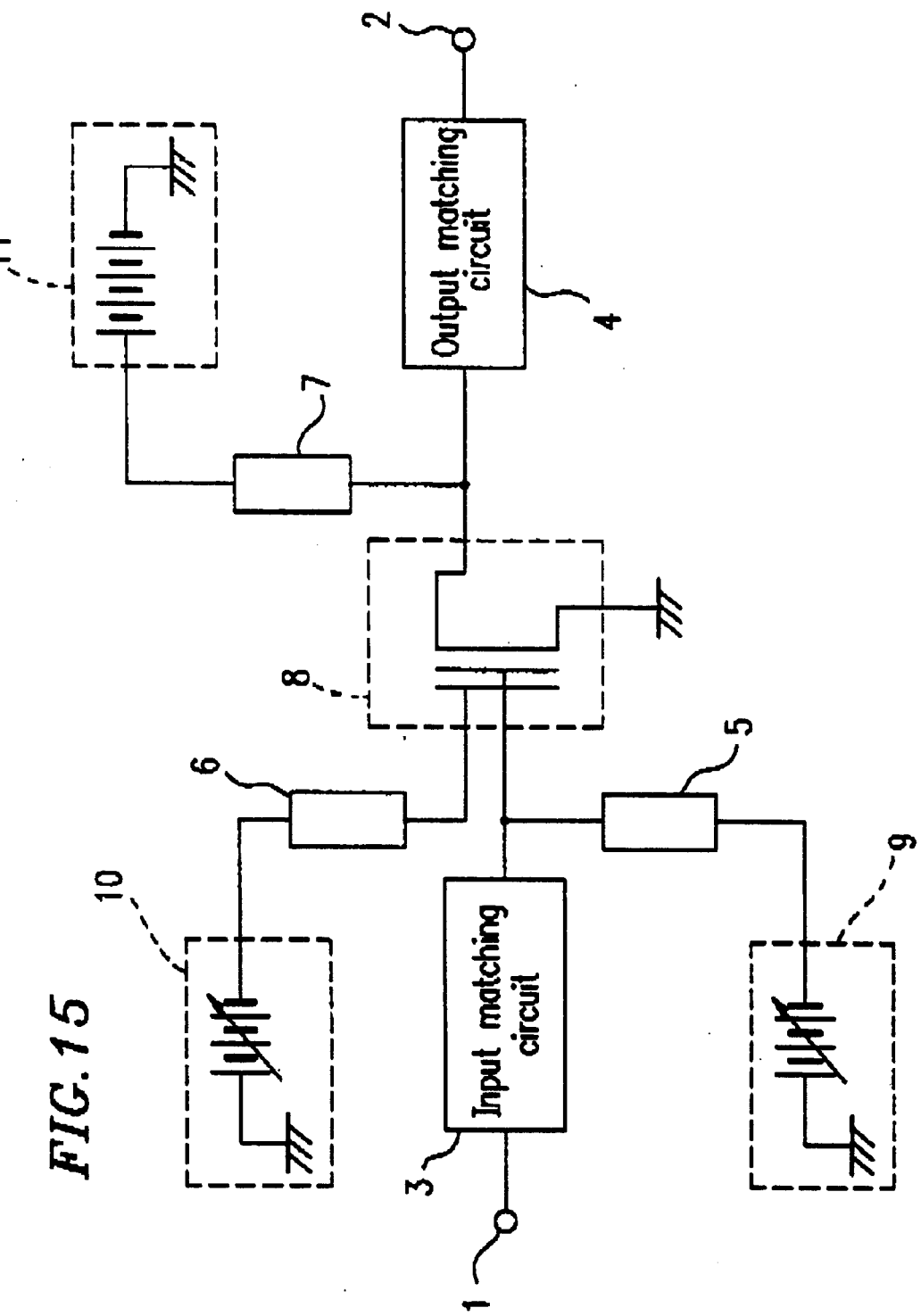
FIG. 15 is a block diagram illustrating a conventional high frequency power amplifier.

At this time, the FET 500 is represented by an equivalent circuit as shown in FIG. 14B. As in the FET 400 according to Example 5 of the present invention, only the channel corresponding to the second drain region 317 is operated while the other channel corresponding to the first drain region 316 is not operated in the FET 500. As a result, an amount of operating current significantly falls, and the channel in an non-operation state serves as a negative feedback circuit for the channel in an operation state.

As is apparent from the comparison between FIG. 14B and FIG. 12B, the difference between Example 6 and Example 5 lies in a variable feedback amount by a negative feedback circuit. The feedback amount by the negative feedback circuit can be adjusted by changing a level of the voltage Vgg3 applied to the second gate terminal 512.

In general, input/output impedance of a dual-gate FET is significantly larger than that of a single-gate FET.

According to the high frequency power amplifier of Example 6, the dual-gate FET having a large input/output impedance is operated at the time of a high output operation. When the dual-gate FET is selected, however, the gate width of the FET becomes larger, resulting in a smaller input/output impedance. The single-gate FET having a small input-output impedance is operated at the time of a low output operation. When the single-gate FET is selected, however, the gate width of the FET becomes smaller, resulting in a larger input/output impedance. In other words, the combination of the dual gate and the large gate width and the combination of the single gate and the small gate width suppress an increase or a decrease in impedance. As a result, a difference in input/output impedances between the high output operation and the low output operation becomes smaller.

Moreover, by optimizing the voltage Vgg3 of the second gate terminal 512, the input/output impedance of the FET at the time of a low output operation can be made substantially the same as that of the FET at the time of a high output operation.

Furthermore, the microprocessor 527 is used to adjust the voltage Vgg1 applied to the first gate terminal 502 at the time of low output operation, thereby further reducing current consumption. A mismatch between the input and the output, which occurs in association with the adjustment of the voltage Vgg1, is corrected by a change of the voltage Vgg3 applied to the second gate terminal 512. In this manner, current consumption can be reduced in a greater amount at the time of low output operation, as compared to the power amplifier according to Example 5 of the present invention.

As described above, the high frequency power amplifier according to Example 6 of the present invention has a significant advantage that current consumption can be significantly reduced at the time of the low output operation while substantially the same input/output matching condition is maintained.

Moreover, although a single high frequency power amplifier is formed in Example 6 of the present invention, multiple high frequency power amplifiers can be structured by serially connecting two or more high frequency power amplifiers so as to obtain a high frequency power amplifier having an increased power gain.

As described above, by forming a high frequency power amplifier using the transistor of the present invention, current consumption at the time of low output operation can be significantly reduced while a match benzene the input and the output is maintained both at the time of high output operation and at the time of low output operation.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A transistor comprising:
   a source region;
   at least two drain regions;
   channels respectively disposed between the source region and each of the at least two drain regions; and
   a gate electrode provided on each of the channels, wherein at least one isolation region is positioned between the at least two drain regions to electrically isolate the at least two drain regions from one another, and a drain electrode is provided on each of the drain regions,
   wherein a boundary between the isolation region and an active region coincides with and is parallel to a longitudinal edge of the gate electrode when the active region is a region under the gate electrode, forming the channels at portions interposed between the source regions and each of the drain regions.

2. A transistor according to claim 1, wherein a dual-gate electrode is provided on at least one of the channels formed between the source region and each of the drain regions.

3. A transistor comprising:
   a plurality of source regions and a plurality of drain regions disposed in an alternate manner, wherein each of the source regions is commonly connected to a source electrode and the drain regions are divided into two groups such that a total area of one of the groups of drain regions is different from a total area of another one of the groups of drain regions, so that each of the drain regions in one group is commonly connected to a first drain electrode and each of the drain regions in one group is commonly connected to a second drain electrode; and
   a comb-shaped gate electrode provided on channels each disposed between each of the source regions and each of the drain regions.

4. A transistor comprising a plurality of source regions and a plurality of drain regions disposed in an alternate manner,
   wherein each of the source regions is commonly connected to a source electrode and the drain regions are divided into two groups so that each of the drain regions in one group is commonly connected to a first drain electrode and each of the drain regions in the other group is commonly connected to a second drain electrode; and
   wherein a comb-shaped first gate electrode is provided on channels each disposed between each of the source regions and each of the drain regions and a comb-shaped second gate electrode is provided on at least one channel adjacent to the first drain electrode, among the channels, so that a dual-gate electrode formed of the first gate electrode and the second gate electrode is provided on the at least one channel adjacent to the first drain electrode.

5. A transistor comprising:
   an emitter;
   at least two collectors; and
   a base disposed between the emitter and the collectors,
   wherein at least one insulator is positioned between the at least two collectors to electrically isolate the at least two collectors from one another; and a collector, electrode is provided on each of the collectors.

6. A power amplifier comprising:
   a transistor including:
      a source region,
      first and second drain regions,
      channels respectively disposed between the source regions and each of the first and the second drain regions; and
      a gate electrode formed on each of the channels, wherein an isolation region is positioned between the first and the second drain regions to electrically isolate the first and the second drain regions from each other, and first and second drain electrodes are provided on the first and the second drain regions, respectively;

a first impedance-matching circuit inserted between an input terminal for inputting an input signal and the gate electrode of the transistor;

a second impedance-matching circuit inserted between the first and the second drain electrodes of the transistor and an output terminal for outputting an output signal;

a gate DC voltage source circuit which is connected to the gate electrode of the transistor;

a first drain DC voltage source circuit which is connected to the first drain electrode of the transistor;

a second drain DC voltage source circuit which is connected to the second drain electrode of the transistor; and a controlling circuit for performing an ON/OFF operation of the first drain DC voltage source circuit.

7. A power amplifier comprising:

a transistor including:
  an emitter,
  first and second collectors, and
  a base disposed between the emitter and the first and the second collectors,
  wherein, an insulator is positioned benzene the first and second collectors to electrically isolate the first and second collectors from each other, and first and second collector electrodes are provided in the first and the second collectors, respectively;

a first impedance-matching circuit inserted between an input terminal for inputting an input signal and the base of the transistor;

a second impedance-matching circuit inserted between the first and the second collector electrodes of the transistor and an output terminal for outputting an output signal;

a base DC voltage source circuit which is connected to the base of the transistor;

a first collector DC voltage source circuit connected to the first collector electrode of the transistor;

a second collector DC voltage source circuit connected to the second collector electrode of the transistor; and a controlling circuit for performing an ON/OFF operation of the first collector DC voltage source circuit.

8. A power amplifier comprising:

a transistor including:
  a source region,
  first and second drain regions,
  channels respectively disposed between the source region and each of the first and the second drain regions,
  a first gate electrode formed on the channels, and
  a second gate electrode formed on the channel disposed between the source region and the first drain region,
  wherein, an insulation region is positioned benzene the first and second drain regions to electrically isolate the first and second drain regions from each other, and first and second drain electrodes are provided in the first and the second drain regions, respectively;

a first impedance-matching circuit inserted between an input terminal for inputting an input signal and the first gate electrode of the transistor;

a second impedance-matching circuit inserted between the first and the second drain electrodes of the transistor and an output terminal for outputting an output signal;

a first gate DC voltage source circuit connected to the first gate electrode of the transistor;

a second gate DC voltage source circuit connected to the second gate electrode of the transistor;

a first drain DC voltage source circuit connected to the first drain electrode of the transistor;

a second drain DC voltage source circuit connected to the second drain electrode of the transistor; and a controlling circuit for performing an ON/OFF operation of the first drain DC voltage source circuit and for controlling an output voltage of the first and the second gate DC voltage source circuits.

* * * * *